(12) United States Patent
Lee et al.

(10) Patent No.: US 12,490,541 B2
(45) Date of Patent: Dec. 2, 2025

(54) SENSOR PACKAGE STRUCTURE

(71) Applicant: TONG HSING ELECTRONIC INDUSTRIES, LTD., Taipei (TW)

(72) Inventors: Chien-Chen Lee, Hsin-Chu County (TW); Li-Chun Hung, Hsin-Chu County (TW); Chia-Shuai Chang, Hsin-Chu County (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 406 days.

(21) Appl. No.: 18/113,709

(22) Filed: Feb. 24, 2023

(65) Prior Publication Data

US 2023/0395634 A1    Dec. 7, 2023

Related U.S. Application Data

(60) Provisional application No. 63/349,565, filed on Jun. 6, 2022.

(30) Foreign Application Priority Data

Dec. 29, 2022    (TW) .................................. 111150509

(51) Int. Cl.
H10F 39/00    (2025.01)

(52) U.S. Cl.
CPC ......... H10F 39/811 (2025.01); H10F 39/804 (2025.01); H10F 39/806 (2025.01)

(58) Field of Classification Search
None
See application file for complete search history.

(56) References Cited

U.S. PATENT DOCUMENTS

| | | | |
|---|---|---|---|
| 7,936,062 B2 | 5/2011 | Humpston et al. | |
| 11,257,964 B2 | 2/2022 | Liu et al. | |
| 11,411,029 B2 | 8/2022 | Chang | |
| 2008/0083964 A1* | 4/2008 | Fujimoto | H10F 39/804 |
| | | | 257/E31.127 |
| 2018/0019274 A1* | 1/2018 | Yang | H10H 20/8506 |
| 2018/0035022 A1* | 2/2018 | Wang | B29C 45/14655 |
| 2019/0019834 A1* | 1/2019 | Tu | H01L 24/48 |
| 2019/0057992 A1* | 2/2019 | Chen | H10F 39/804 |
| 2020/0411574 A1* | 12/2020 | Chang | H10F 39/028 |

* cited by examiner

*Primary Examiner* — Bilkis Jahan
(74) *Attorney, Agent, or Firm* — Li & Cai Intellectual Property (USA) Office

(57) ABSTRACT

A sensor package structure is provided and includes a substrate, a sensor chip disposed on and electrically coupled to the substrate, a light-permeable layer, a supporting layer having a ring-shape and being sandwiched between the sensor chip and the light-permeable layer, and an encapsulant that is formed on the substrate. The supporting layer has an inner roughened surface being ring-shaped and having an irregular pattern. The light-permeable layer, the inner roughened surface of the supporting layer, and the sensor chip jointly define an enclosed space. The sensor chip, the supporting layer, and the light-permeable layer are embedded in the encapsulant, and at least part of outer surface of the light-permeable layer is exposed from the encapsulant. The inner roughened surface is configured to scatter light passing through the light-permeable layer to arrive thereon.

12 Claims, 10 Drawing Sheets

SENSOR PACKAGE STRUCTURE

CROSS-REFERENCE TO RELATED PATENT APPLICATION

This application claims the benefit of priority to Taiwan Patent Application No. 111150509, filed on Dec. 29, 2022. The entire content of the above identified application is incorporated herein by reference.

This application claims the benefit of priority to the U.S. Provisional Patent Application Ser. No. 63/349,565 filed on Jun. 6, 2022, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a sensor package structure.

BACKGROUND OF THE DISCLOSURE

A conventional sensor package structure includes a glass board, a sensor chip, and an adhesive layer that adheres the glass board to the sensor chip. However, light traveling onto the sensor chip by passing through the optical module is easily reflected to affect a sensing region of the sensor chip (e.g., by causing a flare phenomenon at the sensing region).

SUMMARY OF THE DISCLOSURE

In response to the above-referenced technical inadequacy, the present disclosure provides a sensor package structure to effectively improve on the issues associated with conventional sensor package structures.

In order to solve the above-mentioned problems, one of the technical aspects adopted by the present disclosure is to provide a sensor package structure, which includes a substrate, a sensor chip, a supporting layer, a light-permeable layer, and an encapsulant. The sensor chip is disposed on and electrically coupled to the substrate. Moreover, a top surface of the sensor chip includes a sensing region and a carrying region that surrounds the sensing region. The supporting layer has a ring shape and is disposed on the carrying region of the sensor chip. The supporting layer has an inner roughened surface being ring-shaped and having an irregular pattern. The light-permeable layer has an outer surface and an inner surface that is opposite to the outer surface. The light-permeable layer is disposed on the supporting layer, so that the light-permeable layer, the inner roughened surface of the supporting layer, and the sensor chip jointly define an enclosed space. The encapsulant is formed on the substrate. The sensor chip, the supporting layer, and the light-permeable layer are embedded in the encapsulant, and at least part of the outer surface of the light-permeable layer is exposed from the encapsulant. The inner roughened surface is configured to scatter light that passes through the light-permeable layer to arrive thereon.

Therefore, the sensor package structure in the present disclosure is provided with the inner roughened surface having an irregular pattern and being formed on the supporting layer, so that light passing through the light-permeable layer to arrive on the ring-shaped roughened region can be scattered to effectively reduce the flare phenomenon of the sensor package structure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
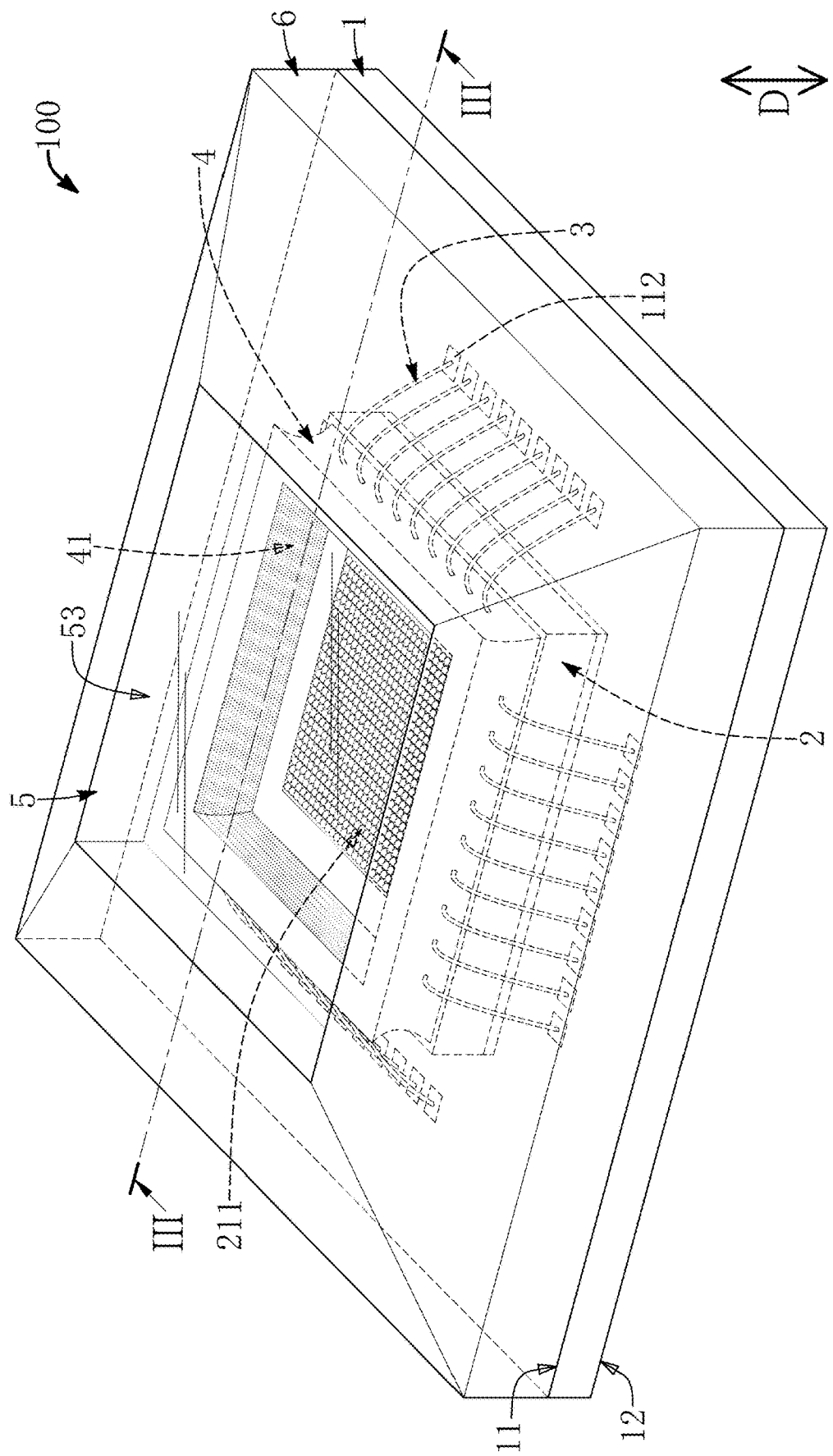
FIG. 1 is a schematic perspective view of a sensor package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 5 a first embodiment of the present disclosure provides a sensor package structure 100. In other words, any package structure not encapsulating a sensor chip therein has a structural design different from that of the sensor package structure 100 of the present embodiment.

Figure 2:
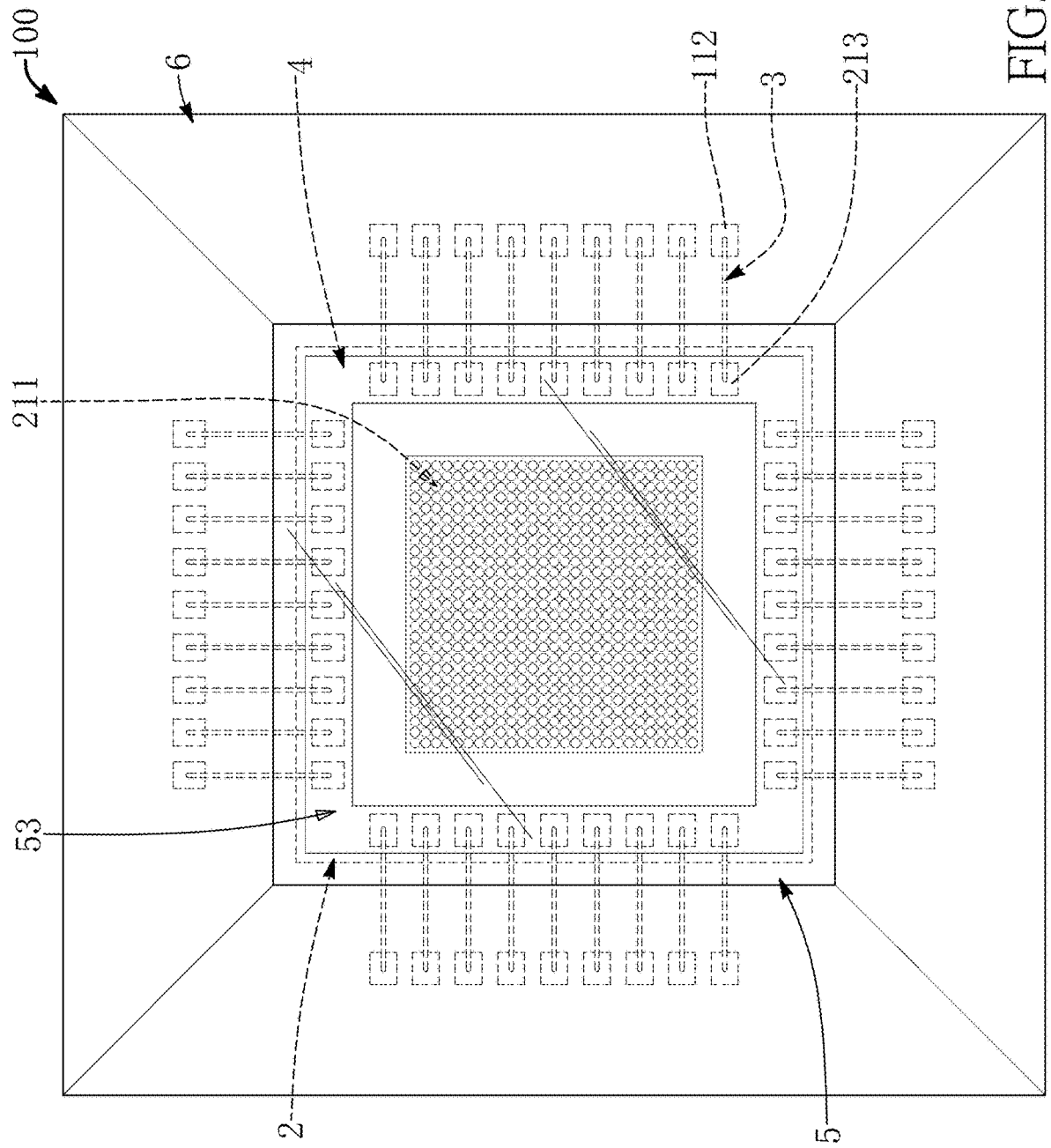
FIG. 2 is a top view of FIG. 1.
Figure 3:
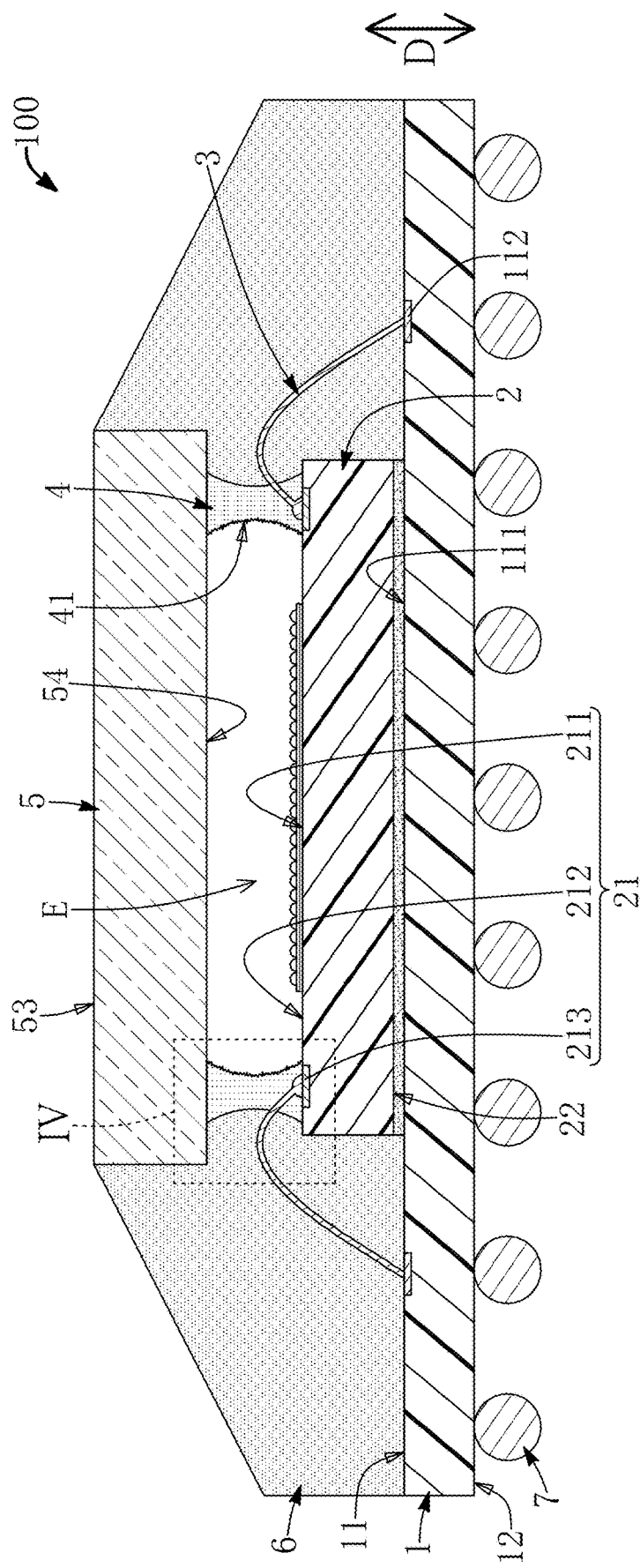
FIG. 3 is a cross-sectional view taken along line III-III of FIG. 1.
Figure 4:
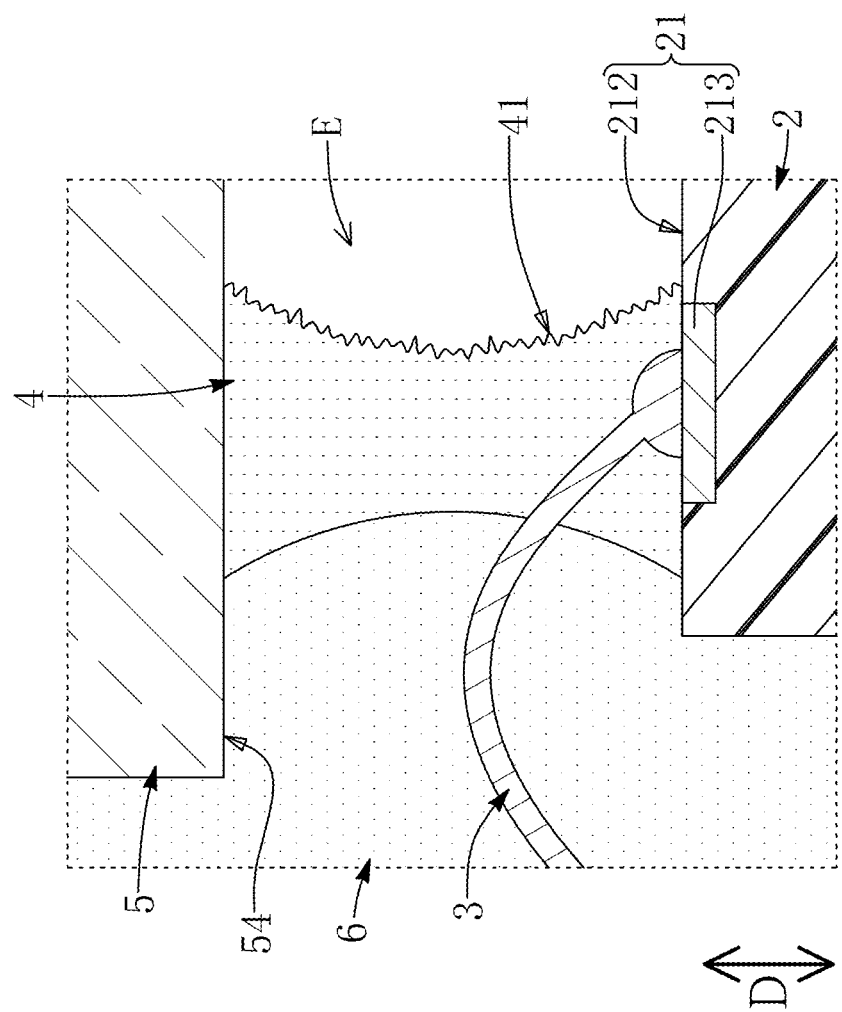
FIG. 4 is an enlarged view of part IV of FIG. 3.

As shown in FIG. 2 to FIG. 4, the sensor package structure 100 includes a substrate 1, a sensor chip 2 disposed on the substrate 1, a plurality of metal wires 3 electrically coupled to the sensor chip 2 and the substrate 1, a supporting layer 4 having a ring shape and being disposed on the sensor chip 2, a light-permeable layer 5 disposed on the supporting layer 4, and an encapsulant 6 that is formed on the substrate 1.

The sensor package structure 100 in the present embodiment includes the above components, but can be adjusted or changed according to design requirements. For example, in other embodiments of the present disclosure not shown in the drawings, the sensor package structure 100 can be provided without the metal wires 3, and the sensor chip 2 is fixed onto and electrically coupled to the substrate 1 in a flip-chip manner or an adhering manner. The structure and connection relationship of each component of the sensor package structure 100 will be recited in the following description.

The substrate 1 of the present embodiment has a square shape or a rectangular shape, but the present disclosure is not limited thereto. An upper surface 11 of the substrate 1 includes a chip-bonding region 111 arranged approximately on a center portion thereof, and the substrate 1 includes a plurality of bonding pads 112 that are disposed on the upper surface 11 and are arranged outside of the chip-bonding region 111. The bonding pads 112 in the present embodiment are in a ring-shaped arrangement, but the present disclosure is not limited thereto. For example, in other embodiments of the present disclosure not shown in the drawings, the bonding pads 112 can be arranged in two rows respectively at two opposite sides of the chip-bonding region 111.

In addition, a plurality of soldering balls 7 can further be disposed on a lower surface 12 of the substrate 1. The substrate 1 can be soldered onto an electronic component (not shown in the drawings) through the soldering balls 7, thereby electrically connecting the sensor package structure 100 to the electronic component.

The sensor chip 2 in the present embodiment has a square shape or a rectangular shape, and is an image sensor chip, but the present disclosure is not limited thereto. A bottom surface 22 of the sensor chip 2 is fixed onto the chip-bonding region 111 of the substrate 1 (through a chip-bonding adhesive along a predetermined direction D). In other words, the sensor chip 2 is arranged to be surrounded on the inside of the bonding pads 112. Moreover, a top surface 21 of the sensor chip 2 has a sensing region 211 and a carrying region 212 that has a ring shape arranged around the sensing region 211. Two ends of each of the metal wires 3 are respectively connected to the substrate 1 and the carrying region 212 of the sensor chip 2, so that the substrate 1 and the sensor chip 2 are electrically coupled to each other.

Specifically, the sensor chip 2 includes a plurality of connection pads 213 arranged on the carrying region 212. In other words, the connection pads 213 are arranged outside of the sensing region 211. The number and positions of the connection pads 213 of the sensor chip 2 in the present embodiment correspond to those of the bonding pads 112 of the substrate 1. In other words, the connection pads 213 in the present embodiment are substantially in a ring-shaped arrangement. Moreover, the two ends of each of the metal wires 3 are respectively connected to one of the bonding pads 112 and the corresponding connection pad 213.

The supporting layer 4 is disposed on the carrying region 212 of the sensor chip 2 and surrounds the sensing region 211. Moreover, the supporting layer 4 in the present embodiment is limited to being an ultraviolet (UV) curing layer (or a photonic curing layer or a thermal curing layer). In other words, the supporting layer 4 of the present embodiment is a structure that can be cured by being irradiated with UV light, but the present disclosure is not limited thereto.

Figure 5:
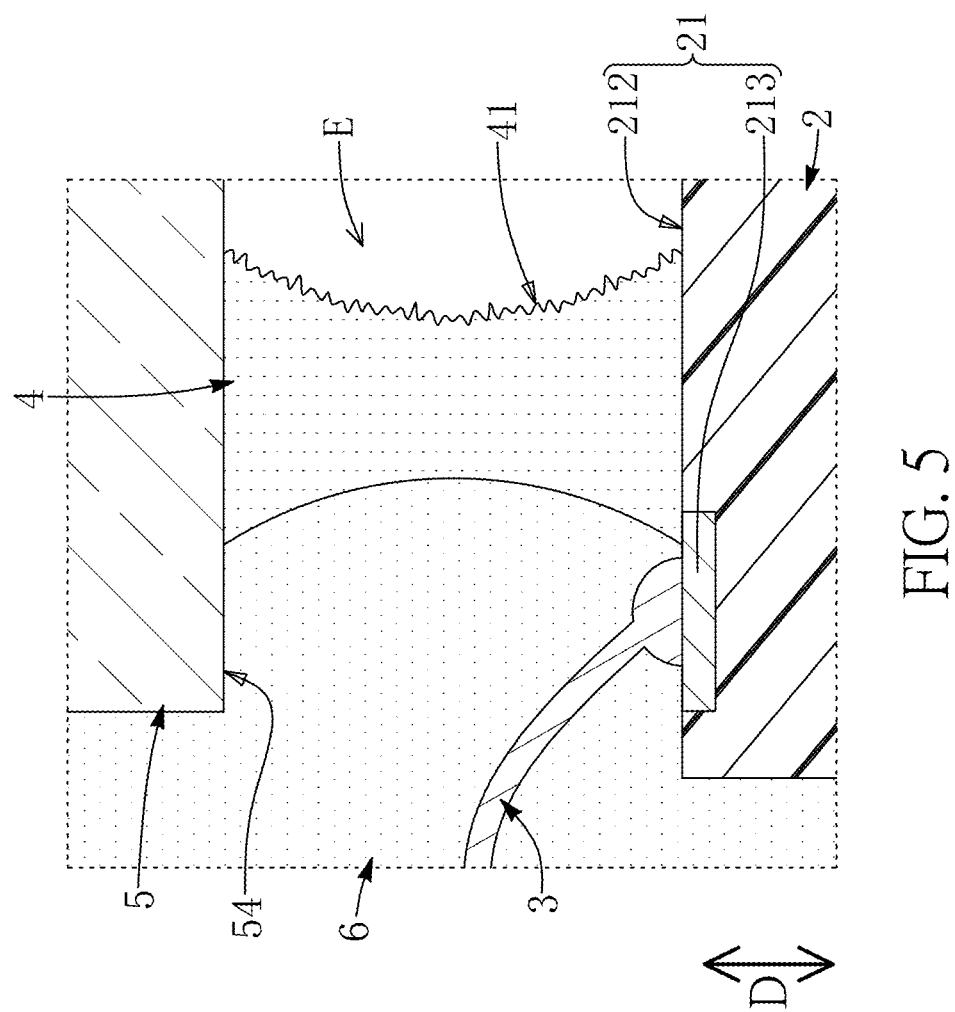
FIG. 5 is an enlarged view showing the part IV of FIG. 3 in another configuration.

Specifically, as shown in FIG. 3 and FIG. 4, a part of each of the metal wires 3 is embedded in the supporting layer 4, and a remaining part of each of the metal wires 3 is embedded in the encapsulant 6, but the present disclosure is not limited thereto. For example, as shown in FIG. 5, the supporting layer 4 can be arranged inside of the metal wires 3 and is not in contact with any one of the metal wires 3 (i.e., each of the metal wires 3 is arranged outside of the supporting layer 4 and is embedded in the encapsulant 6).

As shown in FIG. 2 to FIG. 4, the supporting layer 4 has an inner roughened surface 41 being ring-shaped, and an outer side surface of the supporting layer 4 is not a roughened surface, but the present disclosure is not limited thereto. In the present embodiment, the inner roughened surface 41 is a curved surface and has a haze being within a range from 10% to 90%. The inner roughened surface 41 is preferably formed on an entirety of inner side surface of the supporting layer 4, and the haze of the inner roughened surface 41 is preferably within a range from 30% to 90%, but the present disclosure is not limited thereto.

It should be noted that the inner roughened surface 41 of the supporting layer 4 is limited to having an irregular pattern for effectively enabling uniform scattering of light arriving thereon. In other words, any regular patterns (e.g., a jagged pattern) are excluded from being formed on the inner roughened surface 41 provided by the present embodiment.

In addition, as shown in FIG. 3, a bottom edge of the outer side surface of the supporting layer 4 can be arranged close to an edge of the top surface 21 of the sensor chip 2, thereby properly using the top surface 21 of the sensor chip 2, but the present disclosure is not limited thereto.

As shown in FIG. 2 to FIG. 4, the light-permeable layer 5 in the present embodiment is a transparent and flat glass board, but the present disclosure is not limited thereto. The light-permeable layer 5 has an outer surface 53 and an inner surface 54 that is opposite to the outer surface 53. The light-permeable layer 5 (e.g., the inner surface 54) is disposed on the supporting layer 4, so that the light-permeable layer 5, the inner roughened surface 41 of the supporting layer 4, and the sensor chip 2 jointly define an enclosed space E.

Specifically, the sensing region 211 of the sensor chip 2 is arranged in the enclosed space E, and a center of curvature of the inner roughened surface 41 is also located in the enclosed space E. Moreover, the inner roughened surface 41 is configured to scatter light toward the enclosed space E, where the light passes through the light-permeable layer 5 to arrive on the inner roughened surface 41, thereby effectively reducing the flare phenomenon of the sensor package structure 100.

The encapsulant 6 of the present embodiment is opaque for blocking a visible light from passing therethrough. The encapsulant 6 is a liquid encapsulation and is formed on the upper surface 11 of the substrate 1, and edges of the encapsulant 6 are flush with edges of the substrate 1. The sensor chip 2, the supporting layer 4, the light-permeable layer 5, and at least part of each of the metal wires 3 are embedded in the encapsulant 6, and at least part of the outer surface 53 of the light-permeable layer 5 is exposed from the encapsulant 6, but the present disclosure is not limited thereto.

In summary, the sensor package structure 100 of the present embodiment does not need to have any shielding layer formed on the inner surface 54 of the light-permeable layer 5, so that the supporting layer 4 is able to be completely solidified to prevent the light-permeable layer 5 from being tilted and to further prevent the supporting layer 4 and the light-permeable layer 5 from having the delamination therebetween. Accordingly, the yield of the sensor package structure 100 can be increased.

Second Embodiment

Figure 6:
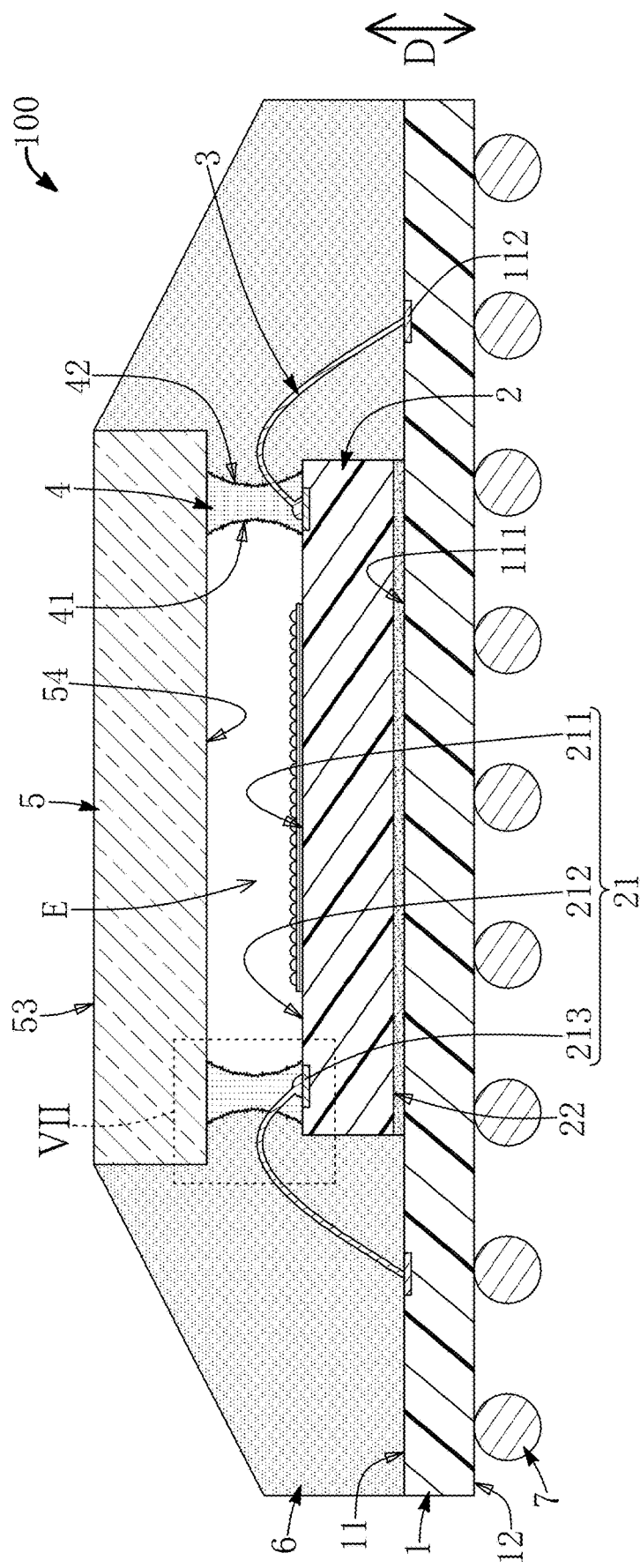
FIG. 6 is a cross-sectional view of the sensor package structure according to a second embodiment of the present disclosure.
Figure 7:
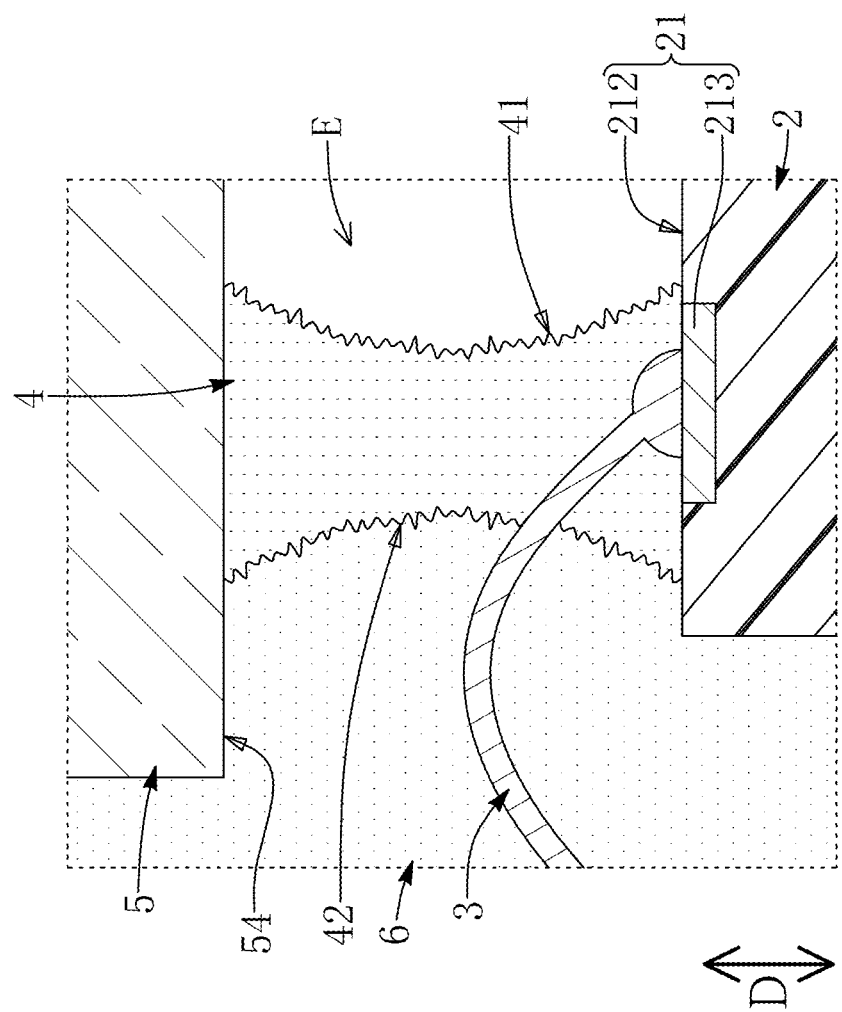
FIG. 7 is an enlarged view of part VII of FIG. 6.

Referring to FIG. 6 and FIG. 7, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

In the present embodiment, the supporting layer 4 further has an outer roughened surface 42 being ring-shaped. The encapsulant 6 of the present embodiment is gaplessly connected to the outer roughened surface 42, thereby effectively increasing the contact area and the bonding force between the encapsulant 6 and the outer roughened surface 42. The outer roughened surface 42 in the present embodiment is a curved surface having a center of curvature located in the encapsulant 6, and the outer roughened surface 42 is preferably formed on an entirety of the outer side surface of the supporting layer 4, but the present disclosure is not limited thereto.

It should be noted that the outer roughened surface 42 has a haze within a range from 10% to 90%, and the haze being preferably within a range from 30% to 90%, and the outer roughened surface 42 of the supporting layer 4 preferably has an irregular shape for enabling light arriving on the outer roughened surface 42 to be uniformly scattered into the supporting layer 4, thereby facilitating the supporting layer 4 to be completely solidified, but the present disclosure is not limited thereto.

Third Embodiment

Figure 8:
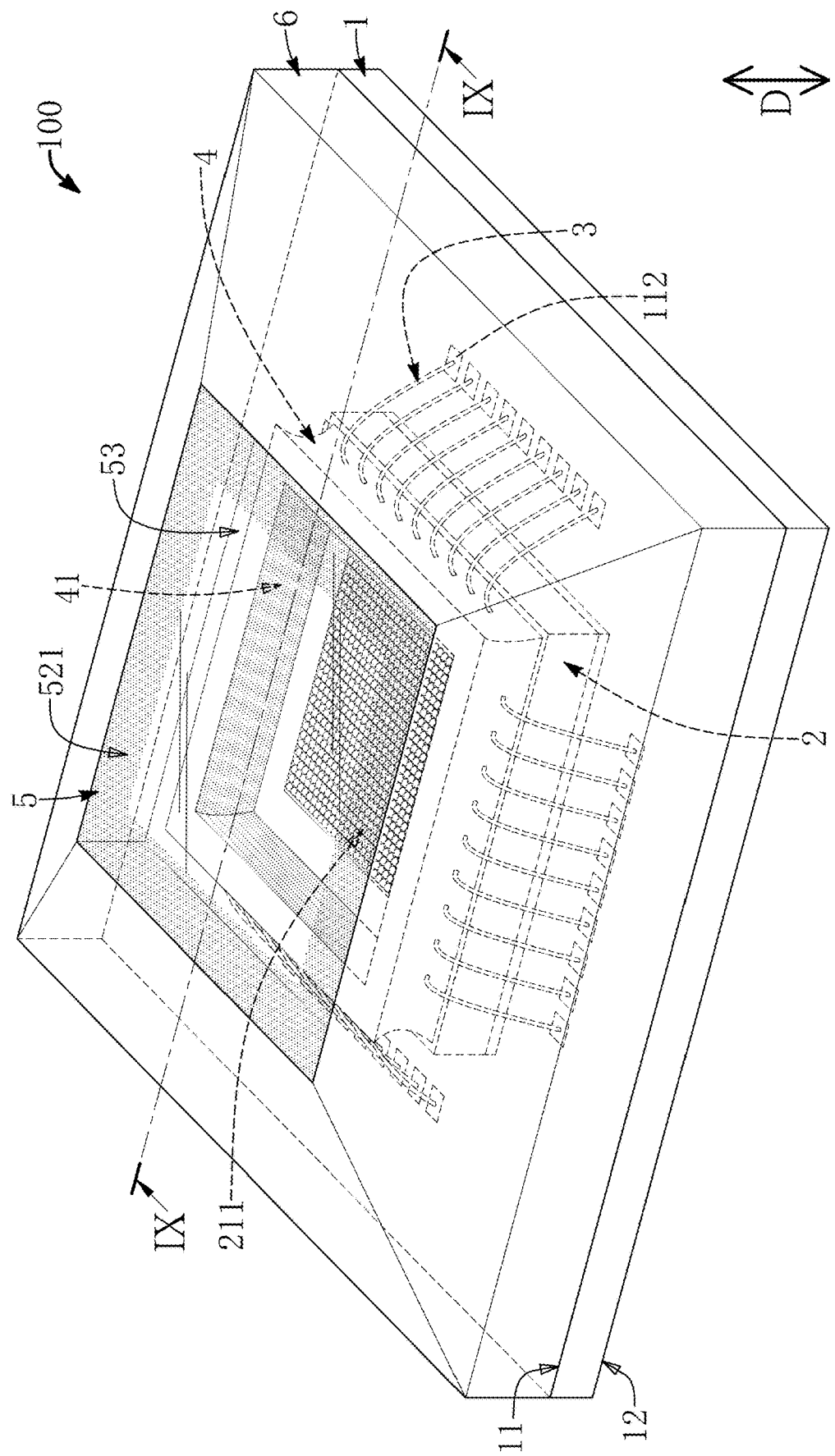
FIG. 8 is a schematic perspective view of the sensor package structure according to a third embodiment of the present disclosure.
Figure 9:
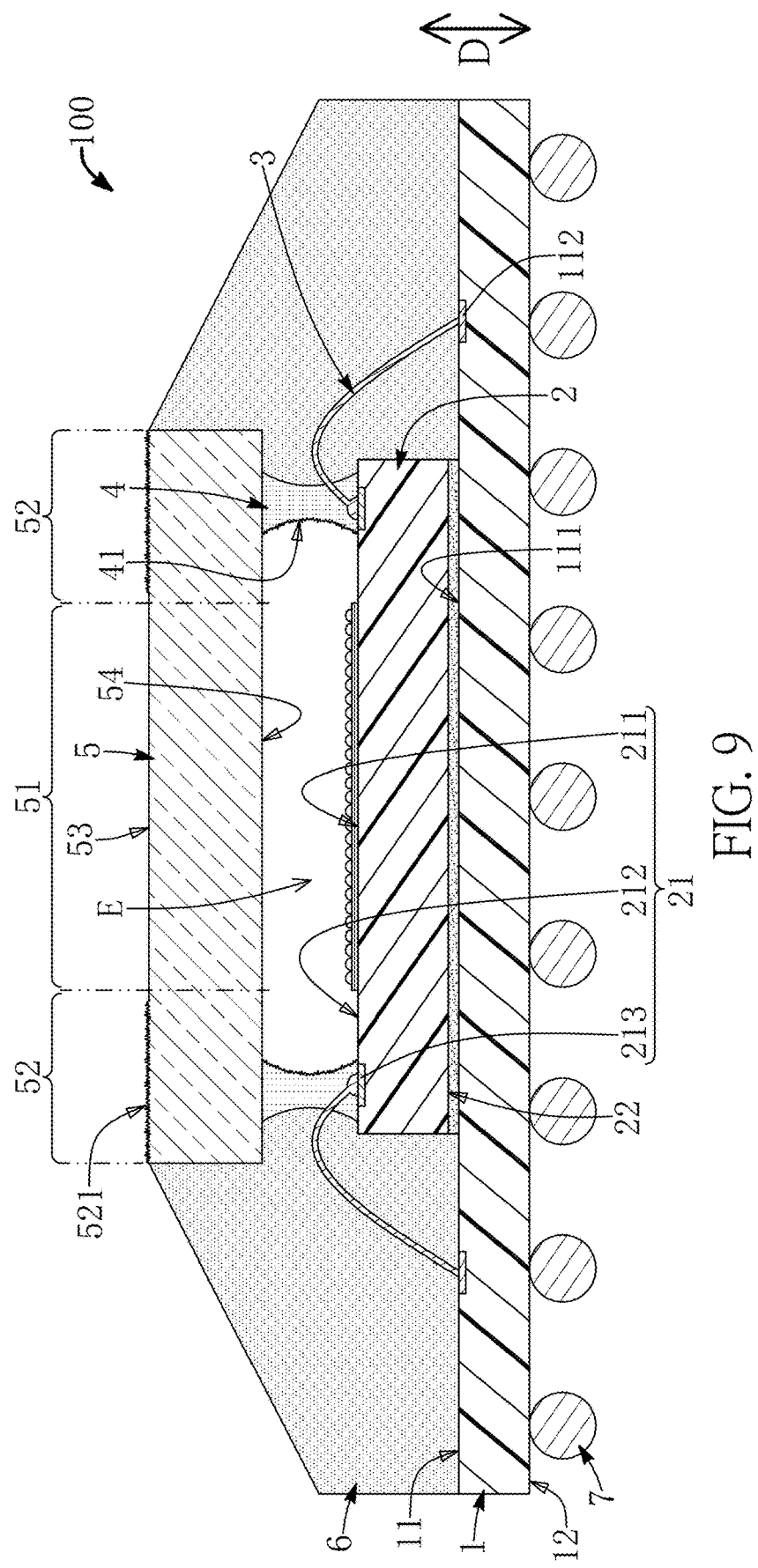
FIG. 9 is a cross-sectional view taken along line IX-IX of FIG. 8.
Figure 10:
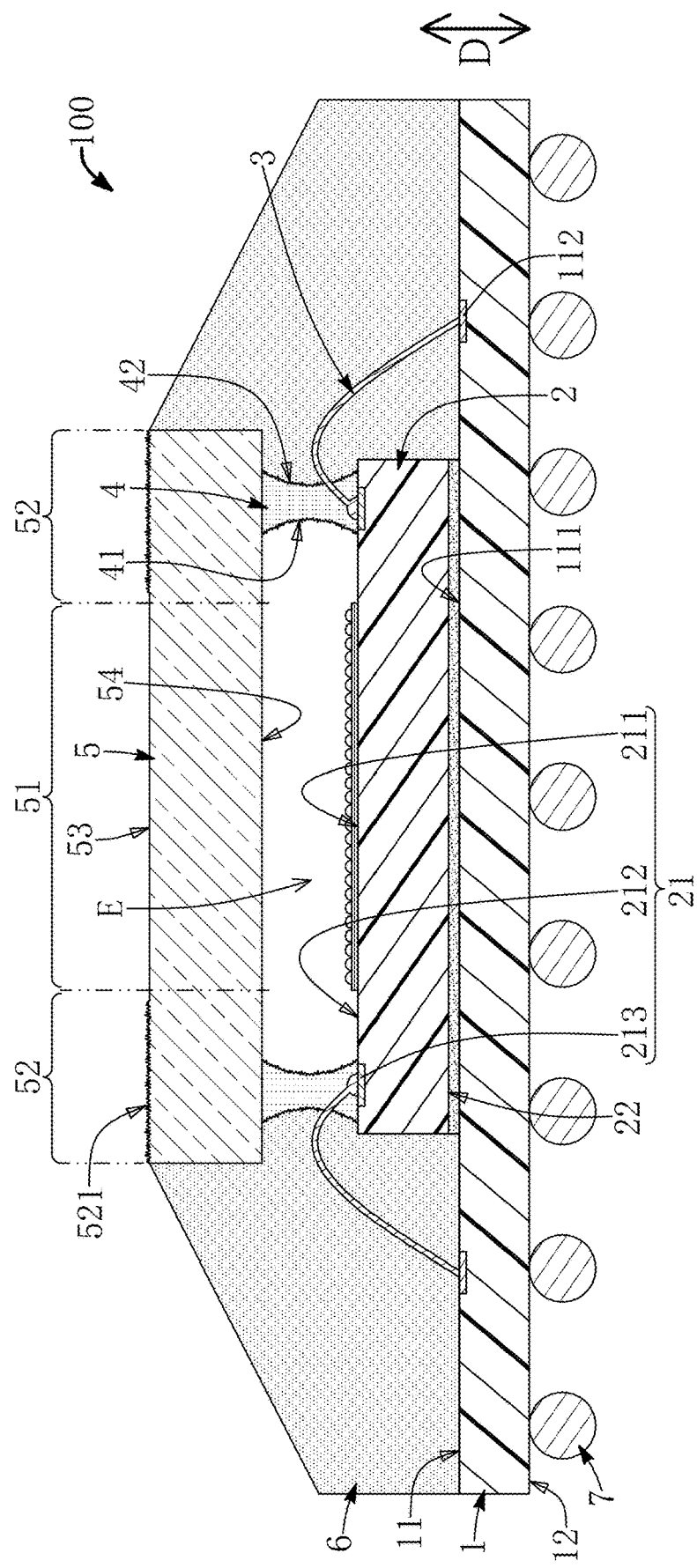
FIG. 10 is a cross-sectional view of the sensor package structure in another configuration according to the third embodiment of the present disclosure.

Referring to FIG. 8 to FIG. 10, a third embodiment of the present disclosure, which is similar to the first and second embodiments of the present disclosure, is provided. For the sake of brevity, descriptions of the same components in the first to third embodiments of the present disclosure will be omitted herein, and the following description only discloses different features among the first to third embodiments.

In the present embodiment, the light-permeable layer 5 has a transparent segment 51 and a ring-shaped segment 52 that surrounds the transparent segment 51. The light-permeable layer 5 is disposed on the supporting layer 4 through the ring-shaped segment 52. The shape and size of the transparent segment 51 in the present embodiment substantially correspond to those of the sensing region 211; in other words, a projection region defined by orthogonally projecting the transparent segment 51 onto the top surface 21 of the sensor chip 2 along the predetermined direction D is substantially overlapped with an entirety of the sensing region 211, but the present disclosure is not limited thereto. For example, in other embodiments of the present disclosure not shown in the drawings, the size of the transparent segment 51 can be slightly greater than that of the sensing region 211.

The ring-shaped segment 52 has a ring-shaped roughened region 521 formed on the outer surface 53. Moreover, a projection space defined by orthogonally projecting the ring-shaped roughened region 521 toward the top surface 21 of the sensor chip 2 along the predetermined direction D is located outside of the sensing region 2 and overlaps an entirety of the inner roughened surface 41 of the supporting layer 4. In other words, light can arrive on the inner roughened surface 41 after the light is scattered through the ring-shaped roughened region 521, thereby further reducing the flare phenomenon of the sensor package structure 100.

It should be noted that the ring-shaped roughened region 521 has a haze within a range from 10% to 90%, and the haze is preferably within a range from 30% to 90%, and the ring-shaped roughened region 521 of the light-permeable layer 5 preferably has an irregular shape for enabling light to be uniformly scattered into the supporting layer 4 by passing through the ring-shaped roughened region 521, thereby facilitating the supporting layer 4 to be completely solidified, but the present disclosure is not limited thereto.

Beneficial Effects of the Embodiments

In conclusion, the sensor package structure in the present disclosure is provided with the inner roughened surface having an irregular pattern and being formed on the supporting layer, so that light passing through the light-permeable layer to arrive on the ring-shaped roughened region can be scattered to effectively reduce the flare phenomenon of the sensor package structure.

Specifically, the sensor package structure of the present disclosure does not require a shielding layer to be formed on the inner surface of the light-permeable layer, so that the supporting layer is facilitated to be completely solidified to prevent the light-permeable layer from being tilted and to further prevent the supporting layer and the light-permeable layer from having the delamination therebetween. Accordingly, the yield of the sensor package structure can be increased.

Moreover, the sensor package structure of the present disclosure can be provided with the outer roughened surface on the outer side surface of the supporting layer and/or the ring-shaped roughened region on the outer surface of the light-permeable layer corresponding in position to ring-shaped segment, so that the supporting layer can be uniformly irradiated by light scattered from the outer roughened surface and/or the ring-shaped roughened region, thereby facilitating the supporting layer to be entirely solidified.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
   a substrate;
   a sensor chip disposed on and electrically coupled to the substrate, wherein a top surface of the sensor chip includes a sensing region and a carrying region that surrounds the sensing region;
   a supporting layer having a ring shape and being disposed on the carrying region of the sensor chip, wherein the supporting layer has an inner roughened surface being ring-shaped and having an irregular pattern;
   a light-permeable layer having an outer surface and an inner surface that is opposite to the outer surface, wherein the light-permeable layer is disposed on the supporting layer, so that the light-permeable layer, the inner roughened surface of the supporting layer, and the sensor chip jointly define an enclosed space; and
   an encapsulant formed on the substrate, wherein the sensor chip, the supporting layer, and the light-permeable layer are embedded in the encapsulant, and at least part of the outer surface of the light-permeable layer is exposed from the encapsulant;
   wherein the inner roughened surface is configured to scatter light that arrives thereon by passing through the light-permeable layer;
   wherein the supporting layer has an outer roughened surface being ring-shaped, and the encapsulant is gaplessly connected to the outer roughened surface.

2. The sensor package structure according to claim 1, wherein the inner roughened surface has a haze being within a range from 10% to 90%.

3. The sensor package structure according to claim 1, wherein the inner roughened surface is a curved surface having a center of curvature located in the enclosed space.

4. The sensor package structure according to claim 1, wherein the supporting layer is an ultraviolet (UV) curing layer, a photonic curing, or a thermal curing layer.

5. The sensor package structure according to claim 1, further comprising a plurality of metal wires, wherein two ends of each of the plurality of metal wires are respectively connected to the substrate and the carrying region of the sensor chip so as to electrically connect the substrate and the sensor chip, and wherein each of the plurality of metal wires is arranged outside of the supporting layer and is embedded in the encapsulant.

6. The sensor package structure according to claim 1, further comprising a plurality of metal wires, wherein two ends of each of the plurality of metal wires are respectively connected to the substrate and the carrying region of the sensor chip so as to electrically connect the substrate and the sensor chip, and wherein a part of each of the plurality of metal wires is embedded in the supporting layer, and a remaining part of each of the metal wires is embedded in the encapsulant.

7. The sensor package structure according to claim 1, wherein the outer roughened surface has a haze within a range from 10% to 90%.

8. The sensor package structure according to claim 7, wherein the outer roughened surface is a curved surface having a center of curvature located in the encapsulant.

9. The sensor package structure according to claim 1, wherein the light-permeable layer has a transparent segment and a ring-shaped segment that surrounds the transparent segment, and wherein the ring-shaped segment is disposed on the supporting layer, and the ring-shaped segment has a ring-shaped roughened region formed on the outer surface.

10. The sensor package structure according to claim 9, wherein a projection space defined by orthogonally projecting the ring-shaped roughened region toward the top surface of the sensor chip is located outside of the sensing region and overlaps an entirety of the inner roughened surface of the supporting layer.

11. A sensor package structure, comprising:
    a substrate;
    a sensor chip disposed on and electrically coupled to the substrate, wherein a top surface of the sensor chip includes a sensing region and a carrying region that surrounds the sensing region;
    a supporting layer having a ring shape and being disposed on the carrying region of the sensor chip, wherein the supporting layer has an inner roughened surface being ring-shaped and having an irregular pattern;
    a light-permeable layer having an outer surface and an inner surface that is opposite to the outer surface, wherein the light-permeable layer is disposed on the supporting layer, so that the light-permeable layer, the inner roughened surface of the supporting layer, and the sensor chip jointly define an enclosed space; and
    an encapsulant formed on the substrate, wherein the sensor chip, the supporting layer, and the light-permeable layer are embedded in the encapsulant, and at least part of the outer surface of the light-permeable layer is exposed from the encapsulant;
    wherein the inner roughened surface is configured to scatter light that arrives thereon by passing through the light-permeable layer;
    wherein the light-permeable layer has a transparent segment and a ring-shaped segment that surrounds the transparent segment, and wherein the ring-shaped segment is disposed on the supporting layer, and the ring-shaped segment has a ring-shaped roughened region formed on the outer surface;
    wherein a projection space defined by orthogonally projecting the ring-shaped roughened region toward the top surface of the sensor chip is located outside of the sensing region and overlaps an entirety of the inner roughened surface of the supporting layer.

12. A sensor package structure, comprising:
    a substrate;
    a sensor chip disposed on and electrically coupled to the substrate, wherein a top surface of the sensor chip includes a sensing region and a carrying region that surrounds the sensing region;
    a supporting layer having a ring shape and being disposed on the carrying region of the sensor chip, wherein the supporting layer has an inner roughened surface being ring-shaped and having an irregular pattern, wherein a jagged pattern is excluded from being formed on the inner roughened surface;
    a light-permeable layer having an outer surface and an inner surface that is opposite to the outer surface, wherein the light-permeable layer is disposed on the supporting layer, so that the light-permeable layer, the inner roughened surface of the supporting layer, and the sensor chip jointly define an enclosed space; and an encapsulant formed on the substrate, wherein the sensor chip, the supporting layer, and the light-permeable layer are embedded in the encapsulant, and at least part of the outer surface of the light-permeable layer is exposed from the encapsulant;

wherein the inner roughened surface is configured to scatter light that arrives thereon by passing through the light-permeable layer.

\* \* \* \* \*